US008244235B2

(12) United States Patent
Ruotolo et al.

(10) Patent No.: US 8,244,235 B2
(45) Date of Patent: Aug. 14, 2012

(54) SYSTEM AND METHOD FOR EXTENDING A MOBILE DEVICE TO CONTROL, CONNECT AND COMMUNICATE WITH EQUIPMENT, NETWORKS AND SYSTEMS

(75) Inventors: Frank Stephen Ruotolo, Newport Beach, CA (US); Filip Toon Peters, Newport Beach, CA (US)

(73) Assignee: Titansan Engineering, Inc., Newport Beach, CA (US)

( * ) Notice: Subject to any disclaimer, the term of this patent is extended or adjusted under 35 U.S.C. 154(b) by 274 days.

(21) Appl. No.: 12/772,098

(22) Filed: Apr. 30, 2010

(65) Prior Publication Data
US 2010/0279736 A1 Nov. 4, 2010

Related U.S. Application Data

(60) Provisional application No. 61/174,908, filed on May 1, 2009, provisional application No. 61/323,245, filed on Apr. 12, 2010.

(51) Int. Cl.
*H04W 24/00* (2009.01)

(52) U.S. Cl. .......................................... 455/423; 700/45
(58) Field of Classification Search .................. 455/408, 455/423; 703/23, 24
See application file for complete search history.

(56) References Cited

U.S. PATENT DOCUMENTS
2008/0112610 A1* 5/2008 Israelsen et al. .............. 382/154
* cited by examiner

*Primary Examiner* — Tu X Nguyen
(74) *Attorney, Agent, or Firm* — Crowell & Moring LLP

(57) ABSTRACT

The functionality of a mobile device is extended to connect to and communicate with a piece of equipment, data storage peripherals and secure networks. Specifically, a mobile device is extended in capability and functionality through the integration with a portable mobile device extender to facilitate seamless connection and communication with a piece of equipment, data storage peripherals and/or secure networks. Another aspect of the disclosure is to effectively enhance real world imagery by merging, on a mobile device, images and video from the real world with and projections from laser or video from a projection device, controlled by the mobile device.

16 Claims, 12 Drawing Sheets

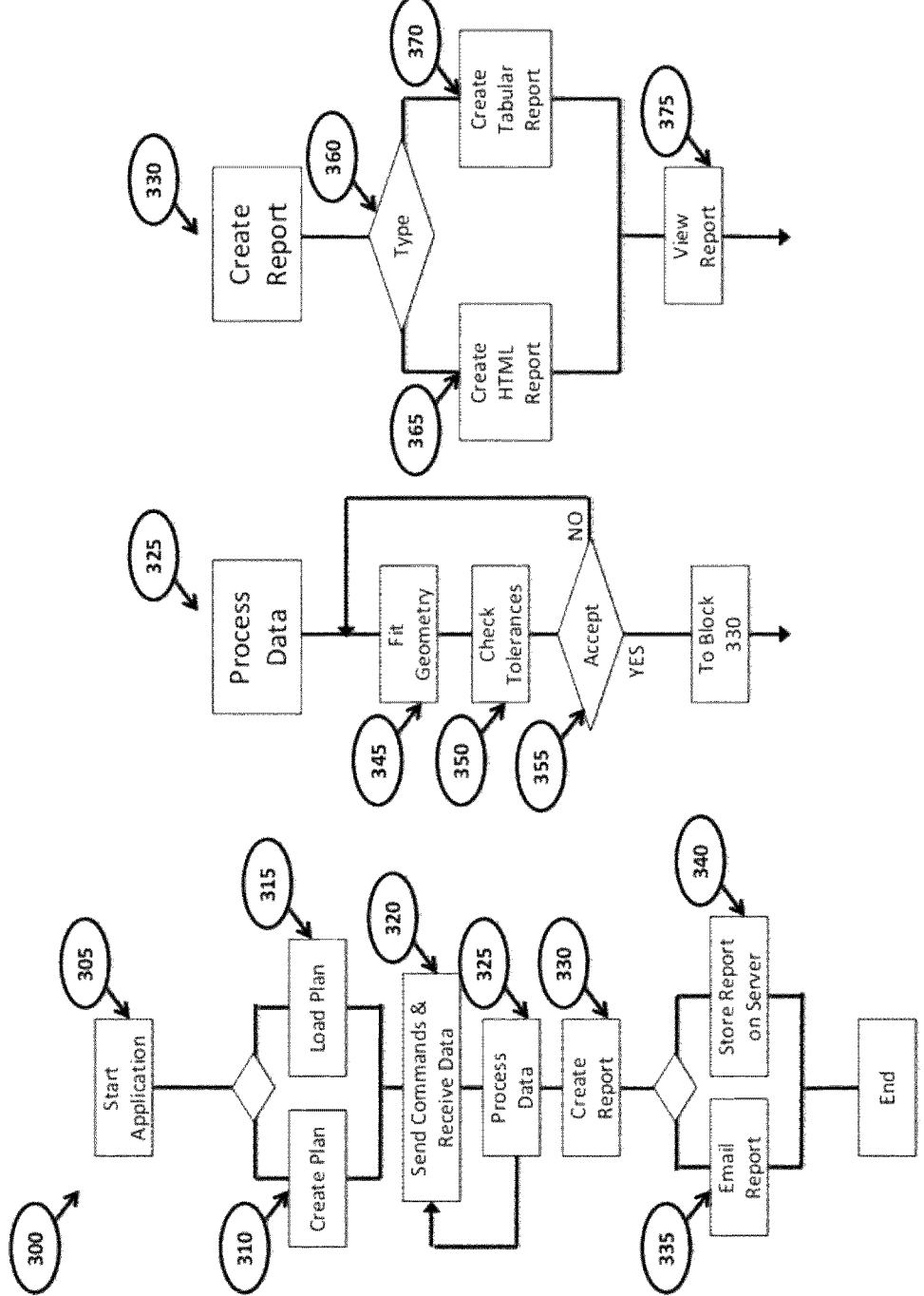
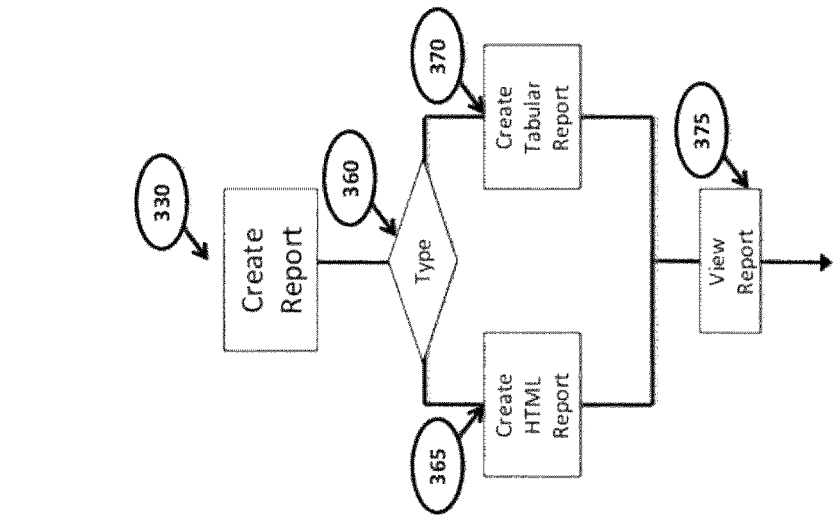
Fig. 3A  Fig. 3B  Fig. 3C

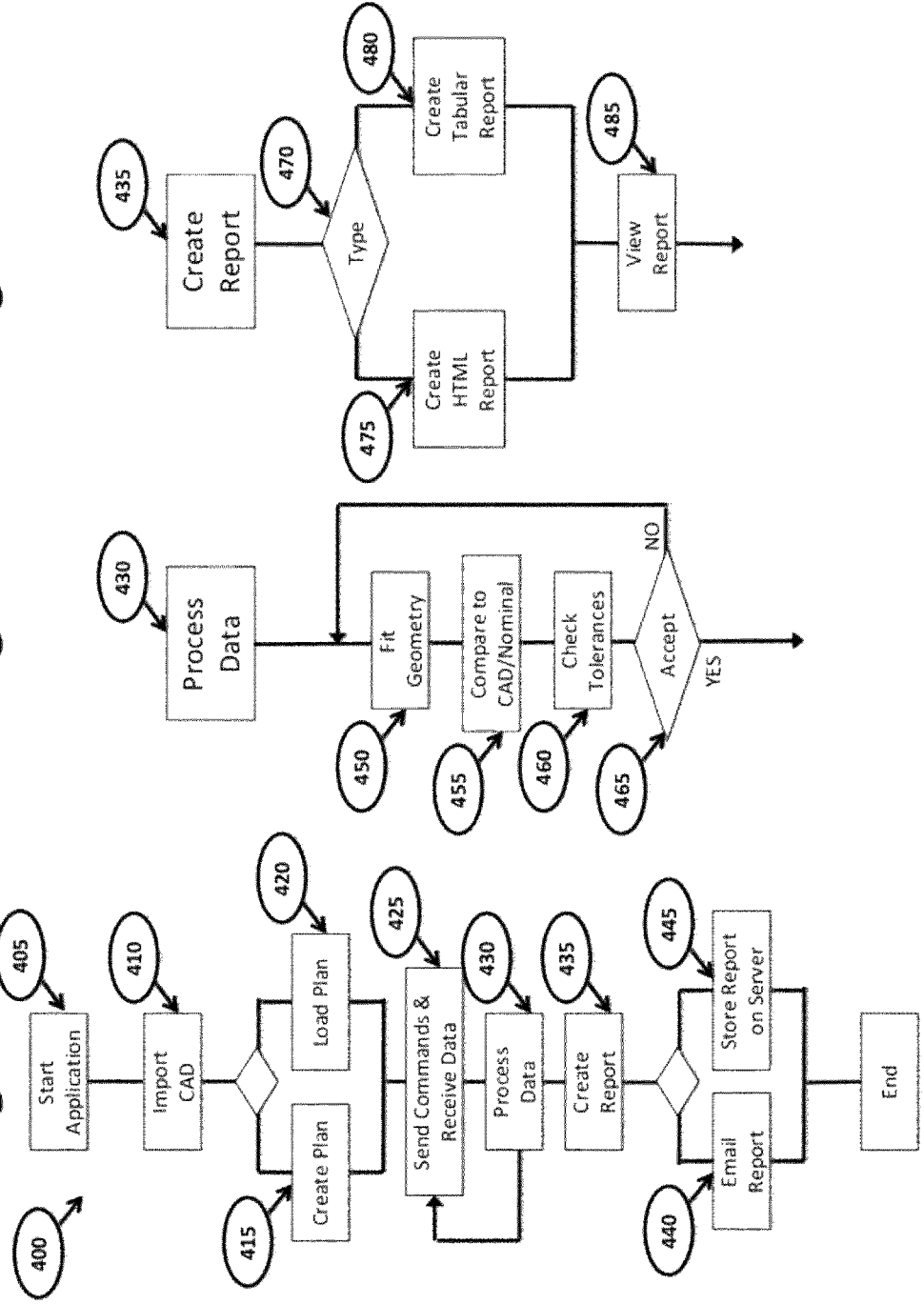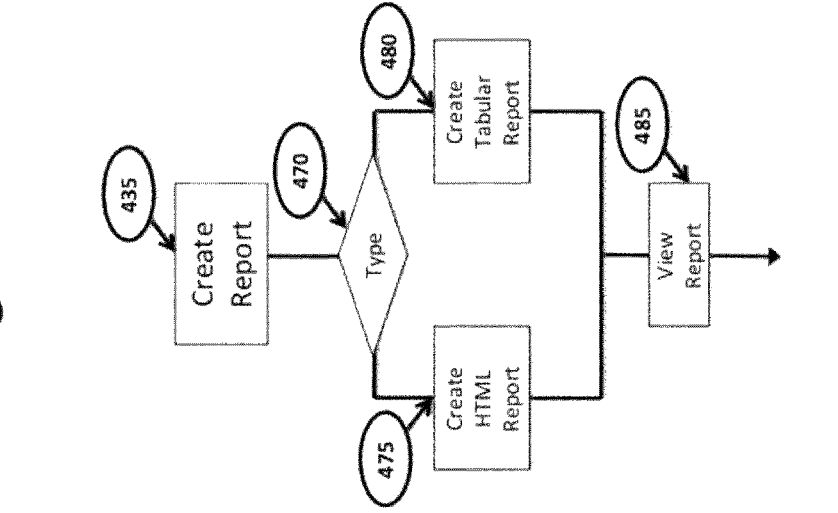

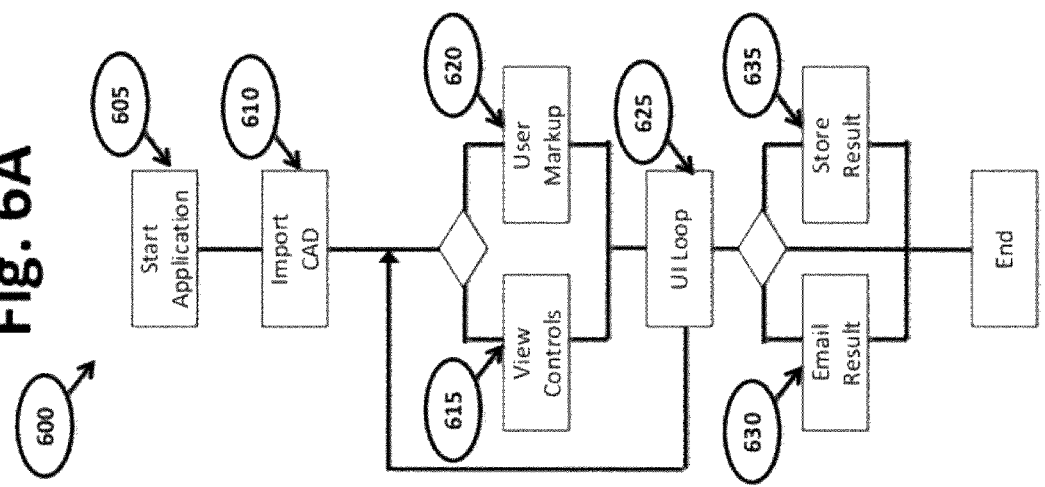
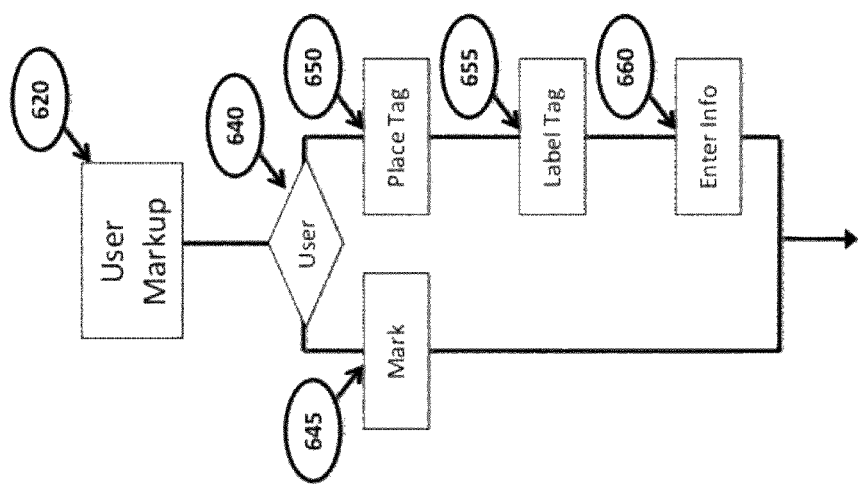

SYSTEM AND METHOD FOR EXTENDING A MOBILE DEVICE TO CONTROL, CONNECT AND COMMUNICATE WITH EQUIPMENT, NETWORKS AND SYSTEMS

CROSS REFERENCE TO RELATED APPLICATIONS

This application claims the benefit of U.S. Provisional Application No. 61/174,908, filed May 1, 2009. This application also claims the benefit of U.S. Provisional Application No. 61/323,245, filed Apr. 12, 2010.

FIELD OF THE INVENTION

The present invention relates in general to control and communications, and in particular to a method and apparatus for extending a mobile device to connect, control and communicate with equipment, systems, peripheral devices/systems and networks.

BACKGROUND

Traditionally, fixed structures, hardware and large computers were used to control equipment for sensing, testing, measurement and related processes. Such structures were typically heavy and non-portable. As a result, objects to be tested had to be moved to the control equipment.

New developments in the industry have made it possible to transport or move the sensing, testing, and measurement tools (equipment and computer) to the objects of interest, such as the objects under test. It has, however, been an incomplete and unsatisfactory solution. The equipment is still large, heavy and non-portable. In addition, the software installed on such equipment is difficult to use and provides little flexibility for adaptation.

Thus, there is a need in the art for a method, while working simultaneously in both the real and virtual worlds, that effectively extends the functionality of a mobile device to make sensing, testing, measurement, projection, marking, etching, painting and related processes completely portable, more intuitive, and highly interactive. In this fashion, improvements in accuracy, speed, and ease-of-use may be realized such that new applications and use in new markets may result.

SUMMARY OF THE INVENTION

Disclosed and claimed herein is a system and method for extending mobile device functionality. In one embodiment, a method includes receiving a command from a mobile device over a first communication link, by a portable mobile device extender, where the command has a first format. The method further includes converting the command into a second format, where the second format corresponds to a piece of measuring equipment coupled to the portable mobile device extender over a second communication link, providing the command to the piece of measuring equipment in the second format over the second communication link, and receiving, over the second communication link, a raw stream of data from the piece of measuring equipment that is responsive to the command. The method further includes providing measurement-related data to the mobile device, where the measurement-related data is based on said raw stream of data, importing a native computer-aided design (CAD) file, comparing at least a portion of the measurement-related data to a nominal set of data from said CAD file, and then generating a report that includes results of such comparison.

A more complete understanding of the present invention will be afforded to those skilled in the art, as well as a realization of additional advantages and objects thereof, by a consideration of the following detailed description. Reference will be made to the appended sheets of drawings, which will first be described briefly.

BRIEF DESCRIPTION OF THE DRAWINGS

The features, objects and advantages of the present disclosure will become more apparent from the detailed description set forth below when taken in conjunction with the drawings in which like reference characters identify correspondingly throughout and wherein:

FIGS. 3A-3C depict various flow diagrams for a first application (gage application) implemented using the system(s) of FIGS. 1A-1C;

FIGS. 4A-4D depict various flow diagrams for additional applications that may be implemented using the system(s) of FIGS. 1A-1C;

FIGS. 6A-6B depict flow diagrams corresponding to further augmenting real world imagery in capability and functionality through the integration, by a mobile device, of native CAD data with user-defined markup—draw and tags, and real world images and video.

DETAILED DESCRIPTION OF EXEMPLARY EMBODIMENTS

Disclosure Overview

Figure 1A:
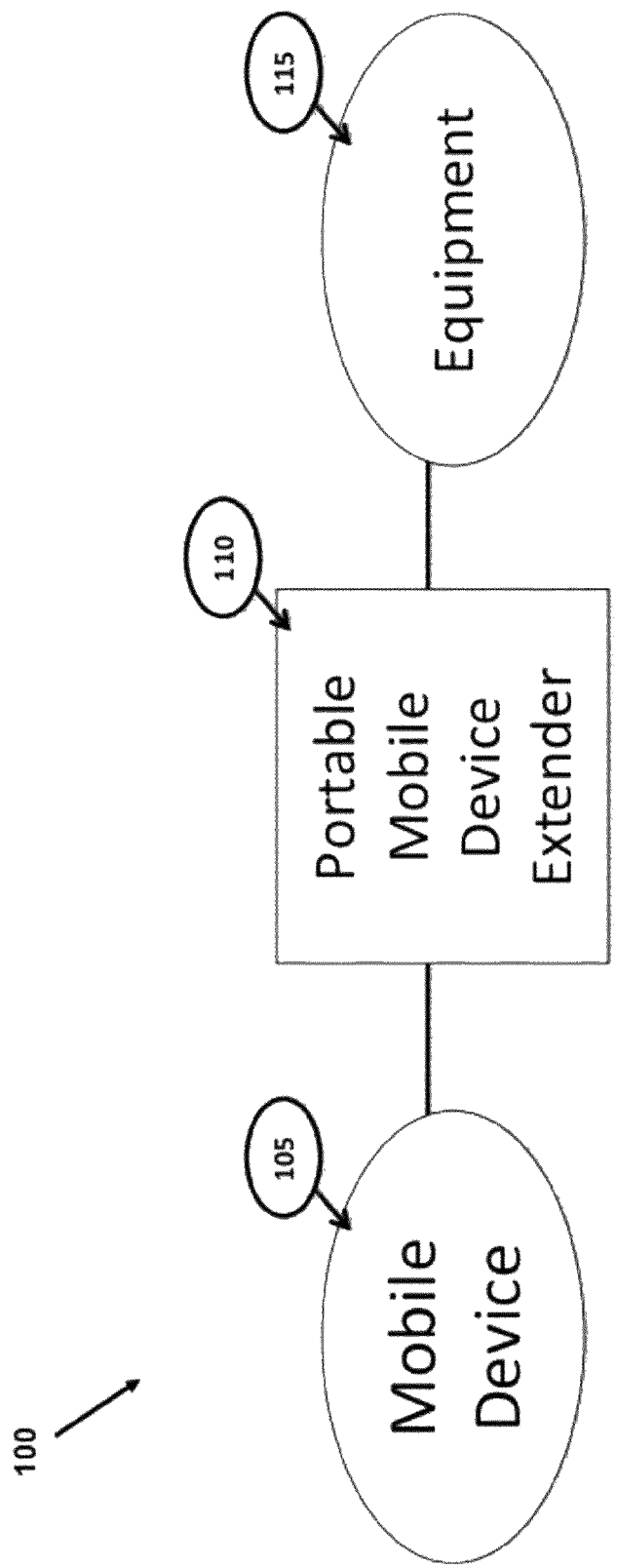
FIG. 1A illustrates a system configured in accordance with the principles of the invention.

One aspect of the present disclosure is to enable the extension of a mobile device by adding the proper connection and communication protocols to make sensing, testing, measurement and related processes completely portable.

In one embodiment, a mobile device is extended in capability and functionality through the integration with a portable mobile device extender to facilitate seamless connection and communication with a piece of equipment, data storage peripherals and/or secure networks, as depicted in detail below with reference to FIGS. 1A-1C. In certain embodiments, the portable mobile device extender may run multiple servers, including for example a communications server, a device server, a file server and SQL server.

Another aspect of the disclosure is to effectively enhance real world imagery by merging, on a mobile device, images and video from the real world with and projections from laser or video from a projection device, controlled by the mobile device, made in the real world.

As used herein, the terms "a" or "an" shall mean one or more than one. The term "plurality" shall mean two or more than two. The term "another" is defined as a second or more. The terms "including" and/or "having" are open ended (e.g., comprising). Reference throughout this document to "one embodiment", "certain embodiments", "an embodiment" or similar term means that a particular feature, structure, or characteristic described in connection with the embodiment is included in at least one embodiment of the present invention. Thus, the appearances of such phrases in various places throughout this specification are not necessarily all referring to the same embodiment. Furthermore, the particular features, structures, or characteristics may be combined in any suitable manner on one or more embodiments without limitation. The term "or" as used herein is to be interpreted as inclusive or meaning any one or any combination. Therefore, "A, B or C" means "any of the following: A; B; C; A and B; A and C; B and C; A, B and C". An exception to this definition will occur only when a combination of elements, functions, steps or acts are in some way inherently mutually exclusive.

In accordance with the practices of persons skilled in the art of computer programming, the invention is described below with reference to operations that are performed by a computer system or a like electronic system. Such operations are sometimes referred to as being computer-executed. It will be appreciated that operations that are symbolically represented include the manipulation by a processor, such as a central processing unit, of electrical signals representing data bits and the maintenance of data bits at memory locations, such as in system memory, as well as other processing of signals. The memory locations where data bits are maintained are physical locations that have particular electrical, magnetic, optical, or organic properties corresponding to the data bits.

When implemented in software, the elements of the invention are essentially the code segments to perform the necessary tasks. The code segments can be stored in a processor readable medium, which may include any medium that can store or transfer information. Examples of the processor readable mediums include an electronic circuit, a semiconductor memory device, a read-only memory (ROM), a flash memory or other non-volatile memory, a floppy diskette, a CD-ROM, an optical disk, a hard disk, etc.

Exemplary Embodiments

With reference to the figures, FIG. 1A depicts one embodiment of a system 100 configured to implement one or more aspects of the invention. As shown, system 100 comprises a mobile device 105, a portable mobile device extender 110 and a piece of equipment 115. The mobile device 105 may be a mobile phone (such as the Iphone™), a PDA, a media-pad or any other similar handheld or portable device. The portable mobile device extender 110 will be described separately in greater detail below. The equipment 115 may be any data output device whether used for measurement, testing, sensing (vibration analysis, size, distance, etc), inspection, quality control, assembly, engineering analysis, design, automation, robot control, surgical and medical equipment control, communication and reporting, device and peripherals control, manufacturing applications, etc.

Figure 1B:
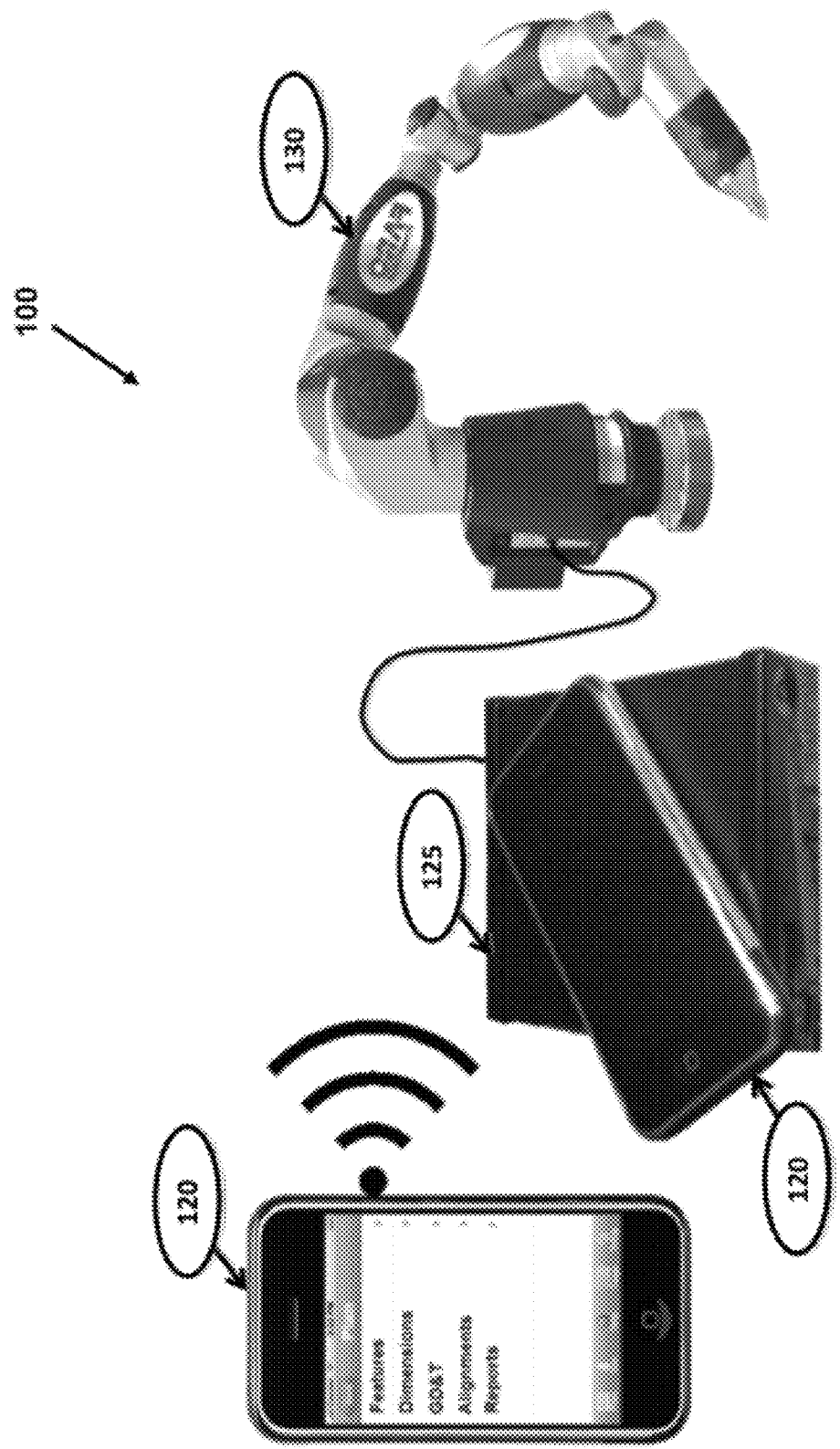
FIG. 1B illustrates one embodiment of the system of FIG. 1A.

FIG. 1B illustrates one embodiment of the system 100 of FIG. 1A in which the mobile device is a cellular phone 120 that is in communication with equipment 130 (via portable mobile device extender 125), where the equipment in this embodiment is a measurement device (e.g., "articulated arm") used for measurement, inspection, and quality control of manufacturing. It should be noted that the cellular phone 120 is also depicted adjacent to the equipment 130 for purposes of demonstrating the relative sizes of each, according to one embodiment.

Figure 1C:
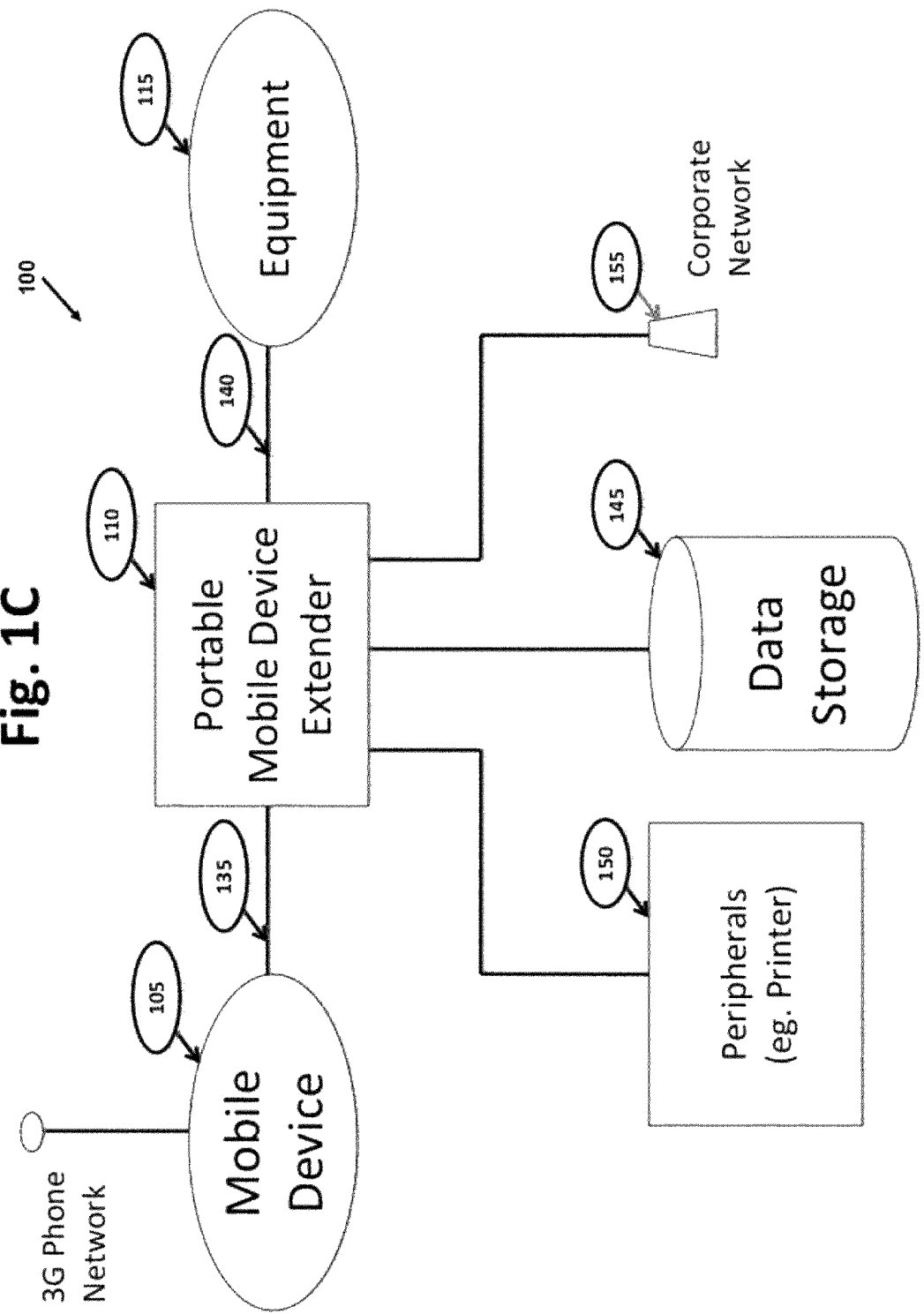
FIG. 1C describes one embodiment of the physical layer of the system of FIG. 1A.

FIG. 1C illustrates a more detailed example of the hardware and connections (the "physical Layer") of the system 100 of FIG. 1A. As shown, the mobile device 105 is configured to communicate on a cellular network and on a second, separate wireless communication link 135. The equipment 115 may be manufacturer-specific and may have be configured to communicate over a wireless or wired communication link 140. Data storage device 145 and peripherals 150 may communicate through industry-standard connections (e.g., SATA, serial, USB, FireWire, Ethernet, etc.) with the portable mobile device extender 110. The portable mobile device extender 110 may also be configured to connect to an external corporate network 155, as shown in FIG. 1C. The portable mobile device extender 110 may be connected between the mobile device 105 and the equipment 115, and in one embodiment, is configured to manage the client-server connections and communication between the mobile device 105 and manufacturer-specific equipment 115.

Figure 1D:
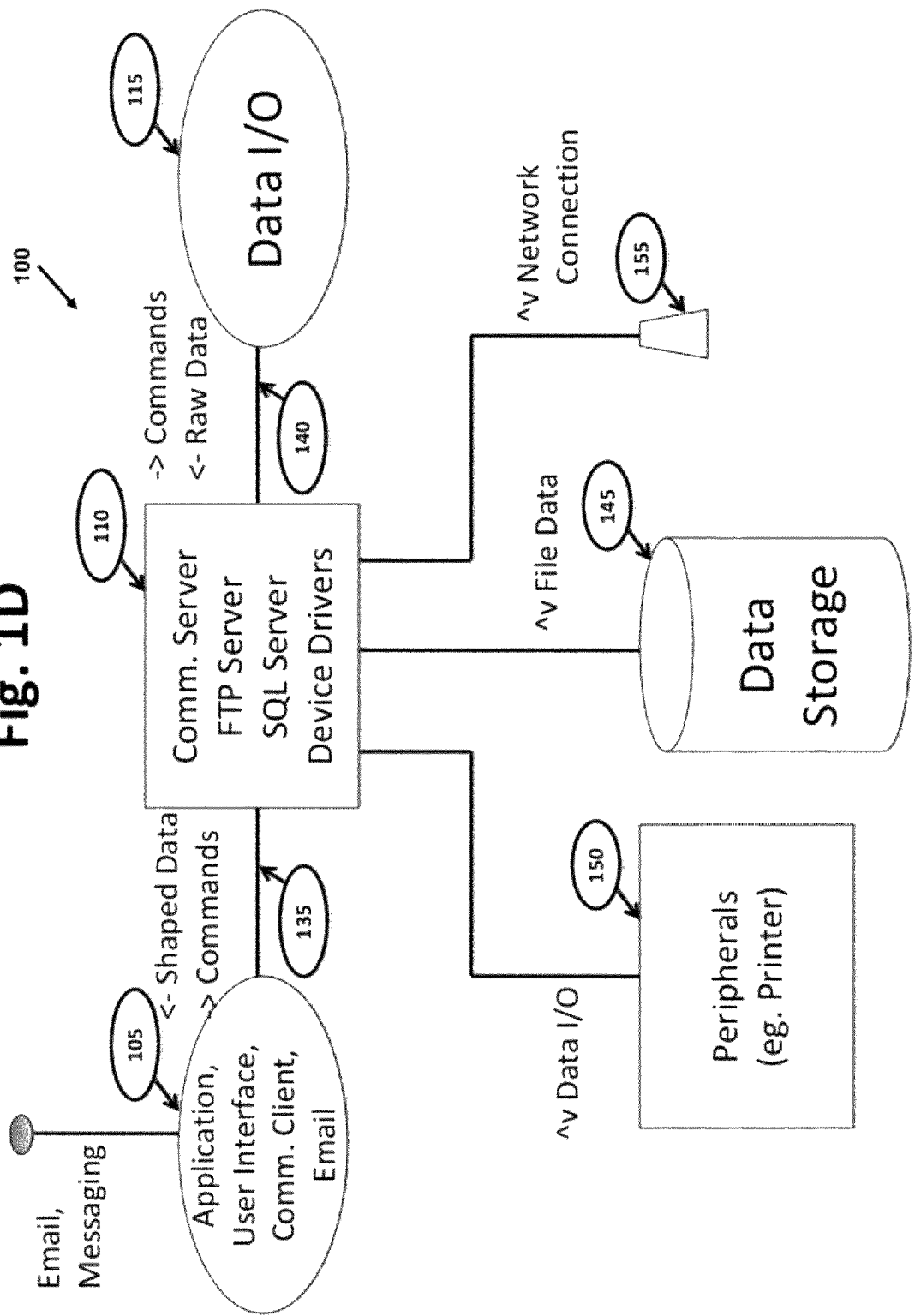
FIG. 1D describes one embodiment of the communication layer of the system of FIG. 1A.

FIG. 1D illustrates one example of the communication layer of system 100 of FIG. 1A. In this embodiment, the mobile device 105 is configured to run one or more applications, provide a user interface, and perform as a communication client to the portable mobile device extender 110. The mobile device may similarly be capable of emailing and/or messaging over a cellular network. In certain embodiments, the mobile device 105 may send commands to the portable mobile device extender 110 over communication link 135 which, in turn, may pass commands on to the equipment 115 over communication link 140. While the equipment 115 may be configured to respond with a single stream of raw data, the mobile device extender 110 may format and respond to the mobile device 105 with a "shaped data stream." The shaping of multiple, simultaneous data streams from a single data stream received from the equipment 115 is another aspect of this disclosure and will be described in greater detail below.

Specifically, since the data might be outputted from the equipment 115 through the portable mobile device extender 110 to the mobile device 105 at a rate that is faster than the mobile device can handle, it may be desirable to parse the raw data stream into multiple data streams. In certain embodiments, one of these multiple streams may be the original, raw stream which, although buffered and therefore delayed, will contain ALL of the data provided by the equipment 115. In addition, an additional stream(s) may contain only the more recent data points, which may be provided in a repetitive or looped fashion. These select data points may be the more relevant information for purposes of what the user is currently viewing/requesting, and/or may be provided as soon as the mobile device is ready to receive more data.

It should be appreciated that the portable mobile device extender 110, which may consist of at minimum a memory containing processor-executable instructions or code segments, a processor, and one or more input/out interfaces, effectively extends the mobile device's capabilities to be functionally similar to a laptop or personal computer. The integration makes it appear as if the mobile device 105 has a hard drive and/or USB, serial, and/or network ports.

Figure 2:
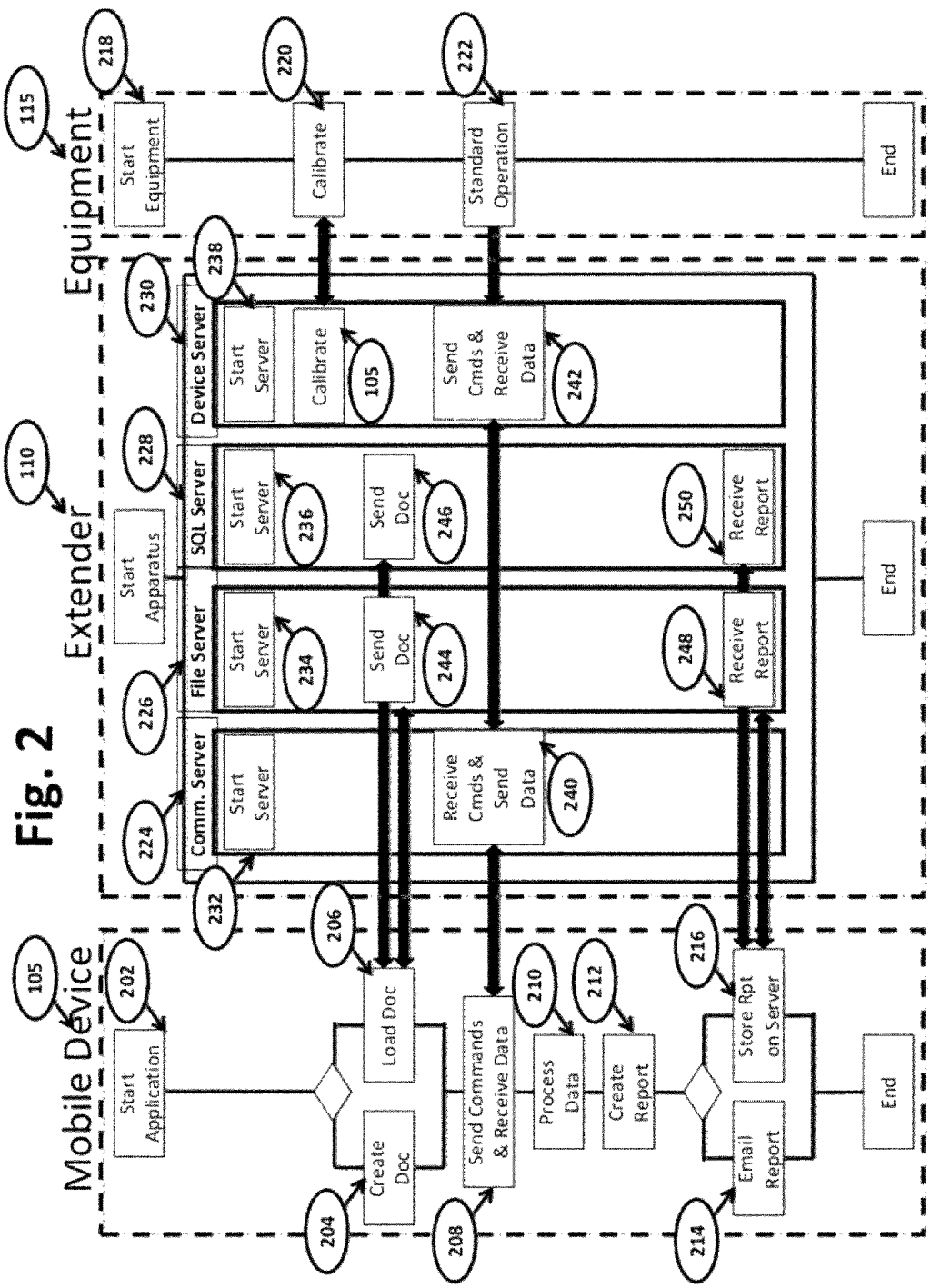
FIG. 2 illustrates how data flows through the system(s) of FIGS. 1A-1C in accordance with the principles of the invention.

Referring now to FIG. 2, depicted is one example of how data may flow through system 100 in accordance with the principles of the invention. Specifically, within the process flow of the mobile device 105, an application is first executed at block 202. Thereafter, one or more documents may be created (block 204) or loaded from memory (block 206). At block 208, the mobile device 105 may send commands and receive data, which may then be processed (block 210) in order to create a report (block 212).

More particularly, the processed data of block 210 is a set of measurement points. When the report is created at block 212, all of the data (plus the most recent parameters) may be run back through the fitting algorithms (e.g., to create geometries) and alignments (e.g., to create coordinate systems), thereby generating a set of mathematical results that are representative of how closely the measurement data correlates to a desired state or value (e.g., measured hole too large or small?). Next, these results may be passed through a user-selected report format to create the final output (e.g., generated report). The generated report may then be emailed to one or more recipients (block 214) and/or saved locally or remotely (block 216). In certain embodiments, the report may contain a list of features (e.g., geometries, sizes, and comparisons) measured in a series of coordinate systems with comparison information relative to a nominal (desired) result. Such reports may also contain a simple 'yes' or 'no' indicator as to whether a particular measured value is within a user-defined tolerance of a desired value.

Within the process flow of the equipment 115, the equipment 115 may be initiated/started (block 218), calibrated if necessary (block 220), and then used in standard operation (block 222).

Continuing to refer to FIG. 2, within the process flow of the portable mobile device extender 110, multiple servers may used to control the multiple processes and communications between each. Specifically, portable mobile device extender 110 may be configured to run multiple servers, such as a communications server 224, a file server 226, an SQL server 228, and a device server 230, which may each be initiated or started (blocks 232, 234, 236 and 238) after (or at the same time) the device is powered on.

In one embodiment, the communications server 224 serves to integrate the mobile device extender 110 with the mobile device 105 and shapes the data streams for optimal performance. Data from the equipment 115 may be sent at speeds greater than the mobile device 105 is otherwise capable of receiving and/or greater processing. Therefore, converting the raw data stream received from the equipment 115 into multiple, simultaneous "shaped data streams" may be desirable.

With respect to shaping the data stream, data for visual display on the mobile device 105 may be filtered to a minimum rate-per-second corresponding to a human response, for example. In contrast, data received by the mobile device 105 for calculations may be filtered to a minimum rate-per-set corresponding to algorithm requirements. Similarly, data for processing may be filtered to a minimum rate-per-set corresponding to acceptable tolerances, user settings, application requirements, and other attributes. Additional data shaping may be applied in accordance with additional end user/device requirements, such as not exceeding a mobile carrier's accepted data rate. This process of data shaping may be performed at block 240 by the communication server 224 and/or at block 242 by the device server 230.

The device server 230 serves to integrate any necessary device drivers for the connected equipment 115, which can comprise any measurement tools, sensors, robots, etc. It should further be appreciated that these device drivers may be operating system-dependent. Therefore, the portable mobile device extender 110 may be configured to run all standard operating systems, which may or may not be the same operating system running on the mobile device 105, thereby providing communication and functional interoperability across disparate platforms. Additionally, at block 244 the device server 230 may be configured to facilitate calibration of the connected equipment 115.

The file server 226 and the SQL server 228 may be configured to function together for the purpose of loading and saving data, documents and the like. In particular, the file server 226 may connect to a storage medium (e.g., hard drive and/or networked drive), while the SQL server 228 may connect to a database on such storage medium and function to load and save data, as well as for integration with any external data control system such as a PLM (Product Lifecycle Management) system or PDM (Product Data Management) system.

For example, in response to a 'load doc' command received from the mobile device 105, at blocks 244 and 246 the file server 226 and SQL server 228 may retrieve and send the requested document(s) back to the mobile device, as shown in FIG. 2. Similarly, the response to a store 'doc command' received from the mobile device 105, at blocks 248 and 250 the file server 226 and SQL server 228 may function to receive and store the provided document (e.g., report) for later use/retrieval.

It should further be appreciated that the portable mobile device extender 110 may include/function as a firewall between a corporate network (e.g., network 155 FIG. 1C) and the mobile device 105. Since the portable mobile device extender 110 may also have a cabled (not wireless) network connection, the mobile device 105 may therefore be configured to share data with computers on a secure corporate network. In this fashion, the mobile device 105 may "see" or communicate directly with the portable mobile device extender 110, while the portable mobile device extender 110 may also "see" or communicate directly with a corporate network.

Moreover, in another embodiment, the portable mobile device extender 110 may be physically integrated into the equipment 115.

In should further be appreciated that the above system may be used in connection with/for numerous applications, some of which include:
1. Data collection for:
   a. Measurement
   b. Testing
   c. Sensor use (vibration analysis, size, distance, etc)
   d. Inspection
   e. Quality Control
   f. Assembly
   g. Reverse Engineering
   h. Automation;
2. Robot control;
3. Surgical and medical equipment control;
4. Communication and Reporting; and
5. Device and peripherals control The Gage Application—(FIGS. 3A-3C)

With reference to FIGS. 3A-3C, one aspect of the disclosure is to implement a gage application comprising a mobile device application usable by the inspection, quality control, assembly, engineering, analysis, design and manufacturing markets. In certain embodiments, the gage application may be used for design & engineering, first article inspection, part inspection, production inspection, tool building, and assembly.

A 'gage' is a tool to measure a one dimensional (1D) feature such as distance (a ruler is a type of gage), or height, or a diameter. More complex gages move along 3 or more axis and are capable of measuring in up to three dimensions (3D). These complex gages accept 3D data from 3D objects and are capable of measuring both simple features, like cylinders and planes, as well as complex geometries like airplane wings and car bodies. The following is a list of exemplary simple gages that can be used in connection with the principles of the invention:

Calipers are used to measure diameters.
Height gages are used to measure height from a flat surface.
Roundness gages are used to measure how round a feature is.
Surface Finish gages are used to measure the finish or roughness or polish of a surface, normally after machining.
Complex Fixtures, etc.

Similarly, complex gages, such as a FARO Gage or Romer MultiGage may be used in accordance with the principles of the invention.

A 'measurement plan' is a sequence of events to describe to the operator how to measure a desired distance/point/surface, etc. For example, each of the following represents a simple measurement plan:

What is the distance between 2 holes?
  Measure two circles
  Report the distance between the circle centers.
Are the corners of a table square?
  Measure the front, back, left, right of a rectangular part
  Report length and width of the part
  Report the angles at the corners.
How tall is an object?
  Place the part of a flat surface.
  Measure the table as Z-height-zero.
  Measure the high point on the part as the Z-height.

With reference now to FIG. 3A, the process flow 300 of a gage application (e.g., implemented using system 100) begins at block 305 with the gage application being executed on a mobile device (e.g., mobile device 105). A plan for inspection or measurement may then be created at block 310 or loaded at block 315. Thereafter, the mobile device may send commands and/or receive data at block 320 from a portable mobile device extender (e.g., portable mobile device extender 110) that is configured in accordance with the principles of the invention. Such commands may include, for example, commands to return the current position/point (XYZ) and/or vector (IJK) and/or button(s) values." Commands may also include instructions to establish communication or perform other device-specific tasks. As described above, it should further be appreciated that the data received at block 320 may be 'shaped' into multiple, separate data streams in order to accommodate the different data rates associated with human response time, device processing speed, acceptable tolerances, user settings, application requirements and/or wireless communication data rates.

Once received, and as will be described in more detail below with reference to FIGS. 3B and 3C, the data may be processed by the mobile device (block 325) and then used to create a report at block 330. Similarly, data may be iteratively received and processed (blocks 320 and 325) prior to a report being generated at block 330.

Once created, the report may be emailed or otherwise transmitted to a desired recipient (block 335) and/or stored for later retrieval (block 340).

With reference to FIG. 3B now, the process carried out at block 325 is described in more detail. Specifically, the received data may be processed to fit geometry at block 345, which most often is done using least-squares fitting algorithms. The results may then be check against tolerances at block 350 and the result either accepted or rejected at block 355. If rejected, the process may be repeated until the results are acceptable, in which case the process continues to block 330, which is described in more detail with reference to FIG. 3C.

With reference now to FIG. 3C, the processed data from block 325 may be used to create a report at block 330. To do so, a type of report may be first selected by the user at block 360, and then either an HTML report (block 365) or tabular report (block 370) and finally to view the report at block 375.

As described above, the processed data 325 may typically comprise a set of mathematical results that are representative of how closely measurement data (received from connected measurement equipment) correlates to a desired state or value (e.g., measured hole too large or small?). And these results may be passed through a user-selected report format to create the final output (e.g., generated report) that contains a list of features (e.g., geometries, sizes, and comparisons) measured in a series of coordinate systems with comparison information relative to a nominal (desired) result. Such reports may also contain a simple 'yes' or 'no' indicator as to whether a particular measured value is within a user-defined tolerance of a desired value.

The CAD-Inspect Application—(FIGS. 4A-4D)

With reference to FIGS. 4A-4D, one aspect of the disclosure is to implement a CAD-Inspect application comprising a mobile device application usable by the inspection, quality control, assembly, engineering, analysis, design and manufacturing markets. In certain embodiments, the CAD-Inspect application may be used for design & engineering, first article inspection, part inspection, production inspection, tool building, and assembly.

Essentially, the CAD-Inspect application may be a more complex version of the gage application referred to above requiring more information including the CAD (computer-aided design) of the item to be inspected or measured. In certain embodiments, the CAD data is the nominal information to which the measured data, or actual information, is compared. In this fashion, the CAD-Inspect application provides an actual-to-nominal comparison using actual CAD data.

With reference now to FIG. 4A, the process flow 400 of a CAD-Inspect application (e.g., implemented using system 100) begins at block 405 with the CAD-Inspect application being executed on a mobile device (e.g., mobile device 105). At block 410, a CAD file is imported and then used to either create (block 415) or load (block 420) a plan for inspection.

Thereafter, at block 425 the mobile device may send commands to and/or receive data from a portable mobile device extender (e.g., portable mobile device extender 110) that is configured in accordance with the principles of the invention. Such commands may include, for example, such commands may include, for example, commands to return the current position/point (XYZ) and/or vector (IJK) and/or button(s) values." Commands may also include instructions to establish communication or perform other device-specific tasks. As previously described, it should further be appreciated that the data received at block 425 may be 'shaped' into multiple, separate data streams in order to accommodate the different data rates associated with human response time, device processing speed, acceptable tolerances, user settings, application requirements and/or wireless communication data rates.

In an iterative fashion, commands may be sent and data received at block 425 and then processed at block 430. Lastly, a report may be generated at block 435 and either emailed (block 440) or saved (block 445).

Referring now to FIG. 4B, the process carried out at block 430 is described in more detail. Specifically, the received data may be processed to fit geometry at block 450 most typically using least-squares fitting algorithms. These results may then be compared to the nominal CAD data at block 455, and the results then checked against tolerances at block 460. If rejected at block 465, the process may be repeated until the results are acceptable, in which case the process continues to block 435, which is described in more detail with reference to FIG. 3C.

With reference now to FIG. 4C, the processed data from block 430 may be used to create a report at block 435. To do so, a type of report may be first selected by the user at block 470, and then either an HTML report (block 475) or tabular report (block 480) and finally to view the report at block 485.

Figure 4D:
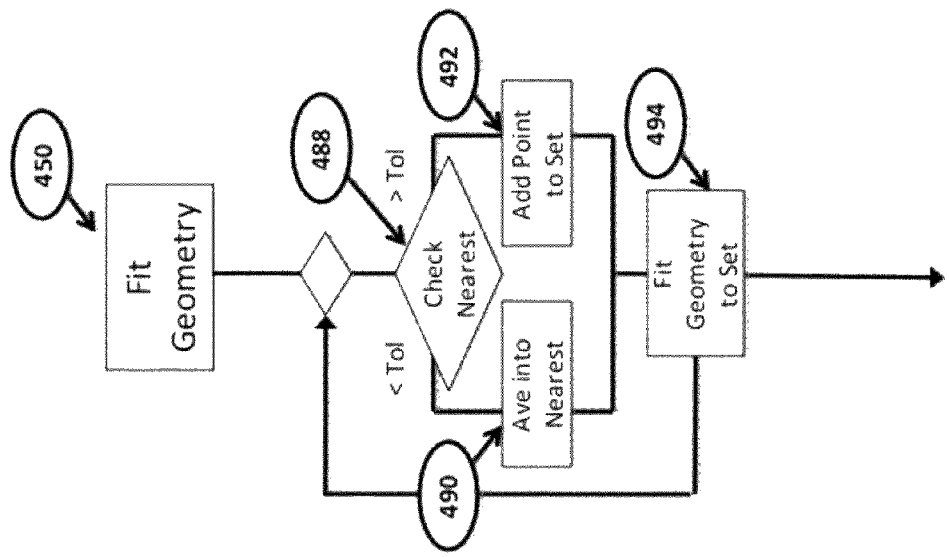

The following is a list of exemplary measurement plans using the CAD-Inspect application that can be implemented in accordance with the principles of the invention:

Import a complex CAD model
Align the measurement device to the part
Best Fit algorithms for "finding" geometry primitives
Comparison of Actuals to Nominals
Best Fit surface profiles to "find" the part within a cloud of data
Reporting results
Quality acceptance (Go/No-Go)
Process control The Improved Fitting Process—FIG. 4D Another aspect of the present disclosure relates an improved fitting process, as shown in FIG. 4D, which is a method for improving accuracy of device measurements used in fitting algorithms.

Every system has some degree of error. It has been observed that some devices, used for measurement and other processes, have a predictable "jitter" that can be eliminated in accordance with the principles described herein. In essence, the improved fitting process is premised on sampling and collecting data over a sampling period, and using all collected data in the core mathematical algorithms. However, not all data will then be applied equally.

By way of example, FIG. 4D describes the operations performed in connection with the fit geometry block 450 in which the improved fitting process is applied. Specifically, the method of fitting geometry (block 450) may be improved by applying an intelligent decision on the raw data (block 488). In certain embodiments, all data points collected during a single operator action (e.g., button push) are collected. These points are then sorted at block 488 according to whether they fall within a predetermined (user-defined) tolerance. That is, if a given sample point is within a tolerance of another sample point (e.g., preceding point) where both points are taken from the same operator action, then these sample points would be averaged together (block 490) and the averaged value added to the discrete point set to be analyzed. That is, at block 490 samples which are within tolerance are averaged to define a single resultant sample point.

If on the other hand, a particular sample point is not with a prescribed tolerance, then the sample point would be separately added to the discrete point set at block 492. Once all of the sampled points have been either grouped (block 492) or averaged together (block 490), the resultant discrete sample points (and only the resultant sample points) are then used in the final calculations at block 494, for example, using a least squares best-fit.

In other words, one aspect of the invention is to undertake an intelligent decision making process about how to group the data. Namely, if the data all exists within a small sphere of size "tolerance" then this must be multiple measurements of the same point and can be averaged into a single point to create a new smaller set of discrete points, which are then used as the resultant points for a fit geometry calculation.

Figure 4E:
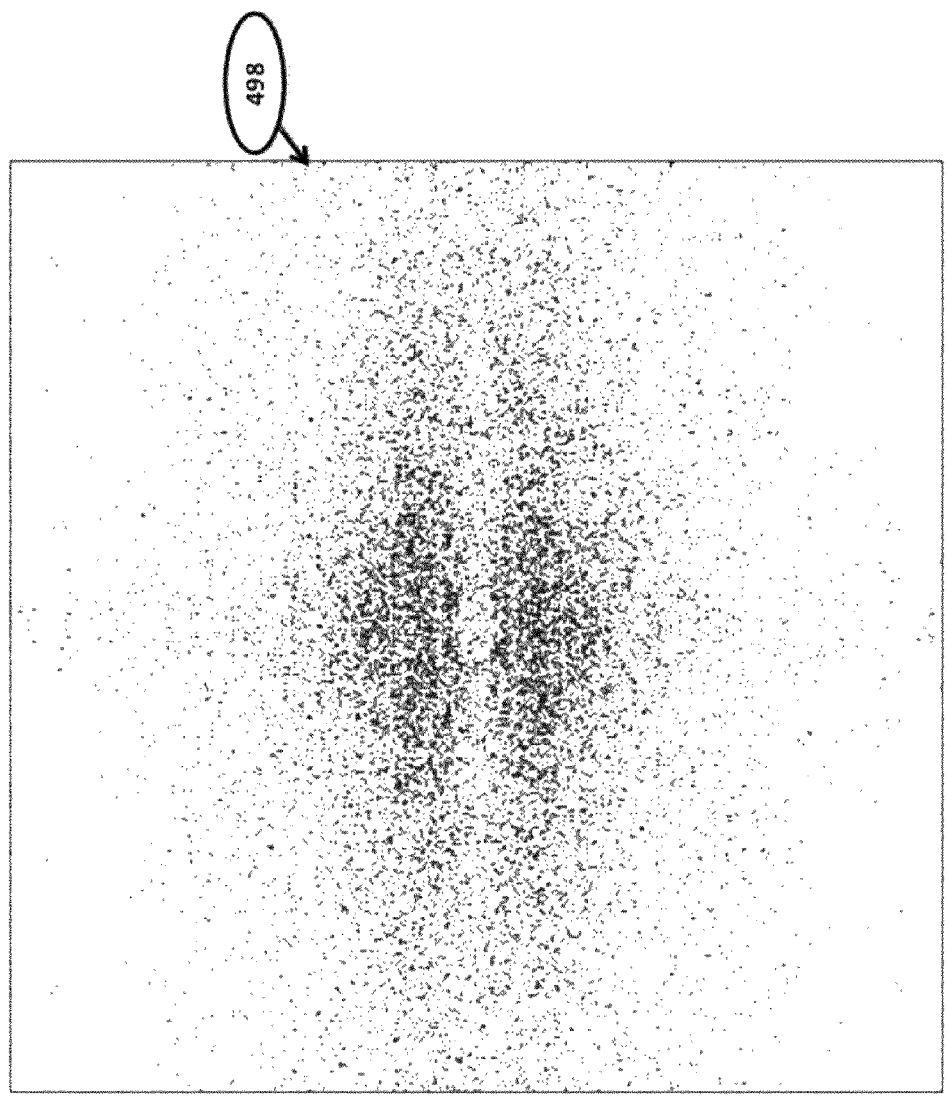
FIG. 4E depicts a graphical representation of an improved geometry fitting process in accordance with the principles of the invention.

By way of example, FIG. 4E illustrates a graphical representation 498 of such a group. Specifically, FIG. 4E is a sample data set for a point cloud representative of multiple measurements as applied to the "check nearest" illustrated in this FIG. 4D.

The Build/Assembly Application—(FIGS. 4A-4D)

In another application, the processes illustrated with reference to FIGS. 4A-4D may similarly be used to implement a Build/Assembly application for tool building, and assembly. The Build/Assembly application may execute on the mobile device in the same manner as the gage or CAD-Inspect applications described above. In addition, the Build/Assembly application may in fact be a variant of the gage application requiring more information including the actual CAD corresponding to the item to be inspected or measured. In certain embodiments, the CAD data is the nominal information to which the measured data, or actual information, is compared. In this fashion, the Build/Assembly application provides an actual-to-nominal comparison using actual CAD data in order to provide the user feedback in connection with the building and/or assembly of tools and objects.

The Caliper Application—(FIGS. 4A-4D)

In another application, the processes illustrated with reference to FIGS. 4A-4D may similarly be used to implement a caliper application for the inspection and small measurements markets.

It should be noted that current digital calipers have no built in math functionality. In accordance with the principles of the invention, a fully portable solution is provided for adding math functionality, including deviation from nominal, meeting ISO standards for dimension reporting, graphics imaging, and even CAD. The following is a list of exemplary caliper-related solutions that can be implemented in accordance with the principles of the invention:

1. Simple solution—"note-taking"
   a. AutoCAD outputs Excel spreadsheet
   b. Follows ISO standard for communication dimensions
   c. Step or select and measure
   d. Report
2. Mid-solution—"draw and measure"
   a. Graphics-assist
   b. User draws a simple 2D structure in the application running on the mobile device.
   c. Step or select and measure
   d. Report
3. CAD solution—"formal plan"
   a. Graphics-based
   b. AutoCAD
   c. Select dimensions from image
   d. Report The Laser-Distance Application—(FIGS. 4A-4D)

In still another application, the processes illustrated with reference to FIGS. 4A-4D may similarly be used to implement a laser-distance meter application for the construction and home improvement markets.

Current distance meters have only basic and simple math functionality built in: add, subtract, area, volume, etc. In accordance with the principles of the invention, a fully portable solution is provided for adding significantly more functionality including deviation from nominal, meeting ISO standards for dimension reporting, graphics imaging, and even CAD. The following is a list of exemplary laser-distance-meter-related solutions that can be implemented in accordance with the principles of the invention:

1. Simple solution—"note taking"
   a. AutoCAD outputs Excel spreadsheet
   b. Follows ISO standard for communication dimensions
   c. Step or select and measure
   d. Report
2. Mid-solution—"draw and measure"
   a. Graphics-assist
   b. User draws a simple 2D structure in the application running on the mobile device.
   c. Step or select and measure
   d. Report
3. CAD solution—"formal plan"
   a. Graphics-based
   b. Auto CAD
   c. Select dimensions from image
   d. Report In other embodiments, the portable mobile device extender described herein can be integrated directly into a piece of equipment (e.g., gage or digital caliper) and subsequently connected to the mobile device 105 using custom cabling.

Augmenting Real Word Imagery with Virtual Imagery

As mentioned above, another aspect of the present disclosure is to effectively enhance real world imagery by merging, on a mobile device, images and video from the real world with projections from laser or video from a projection device, controlled by the mobile device. In one embodiment, reality is augmented in capability and functionality through the integration of a mobile device, native CAD (computer-aided design) data, and real world images and video.

Figure 5C:
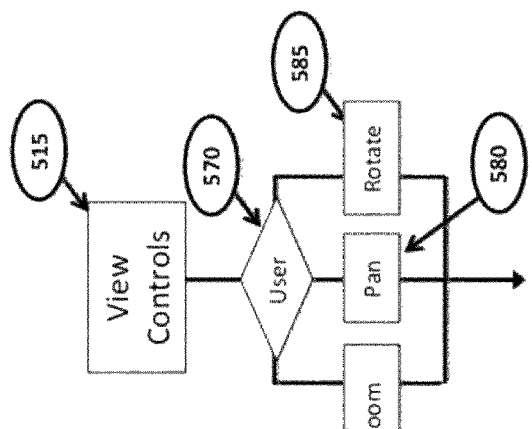
FIG. 5A-5C depict various flow diagrams for merging real world imagery, on a mobile device, with images and video from the real world using the system(s) of FIGS. 1A-1C.
Figure 5B:
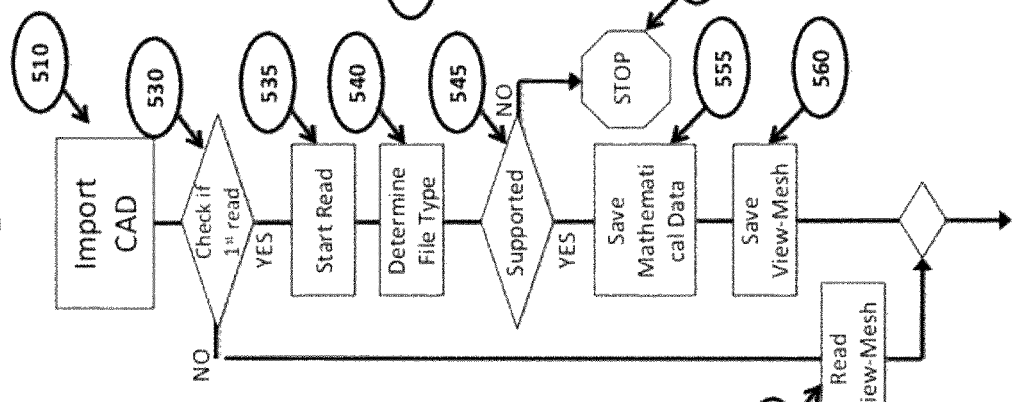
Figure 5A:
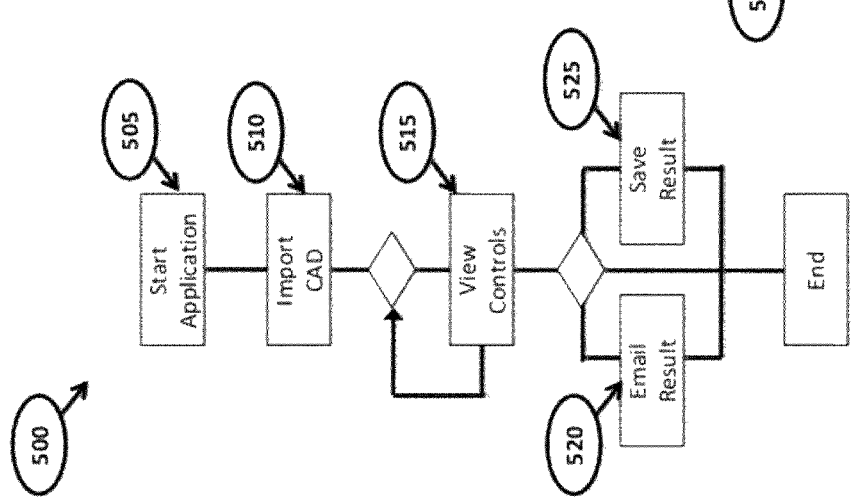

By way of example, FIG. 5A illustrates one embodiment of a process 500 to be performed by a "Native CAD View Application" executing on a mobile device, such as mobile device 105, in a system, such as system 100 of FIG. 1A. The Native CAD View Application is a mobile device application for the import and viewing of native CAD files for the design, engineering, manufacturing, assembly, quality control, reverse engineering, projection, composite ply layout, marking, etching, and painting markets. The Native CAD View Application can be used for design & engineering, part & feature comparison, first article inspection, part inspection, production inspection, tool building, assembly, composite ply layout, marking, etching, and painting.

The process 500 begins at block 505 where the native CAD view process 500 with the Native CAD View Application being executed on a mobile device (e.g., mobile device 105). At block 510, a CAD file is imported into the mobile device, as will be explained in more detail below with reference to FIG. 5B. Thereafter, a user interface of the mobile device functions to receive one or more user inputs regarding how the CAD file data is viewed (see FIG. 5C below).

The resulting image view may then be emailed or otherwise transmitted to a desired recipient (block 520) and/or stored for later retrieval (block 525).

Referring now to FIG. 5B, the import CAD process of block 510 is improved by maintaining the original native CAD data, a proprietary mathematical representation of the same data, and a proprietary viewable representation of the same data. The proprietary formats may be created as soon as the model is first available. The import CAD operation of block 510 begins with a check if this is the first data read (block 530). If this is not the first read, then the view-mesh may be read (block 565). If this is the first read, then the import process starts the read (block 535), determines the file type (block 540), and checks if this file type is supported (block 545). If this file type is not supported then the read may stop (block 550). If the file type is supported, then a mathematical representation of the CAD data may be created and saved (block 555) and a viewable representation of the CAD data created and saved (block 560).

Intelligent decisions regarding which model or piece of model to load improves the process. For example, once the native CAD data is imported, multiple data sets may be maintained—the native CAD data, a separate proprietary CAD format, a viewable data format (e.g., a triangulated mesh), an intermediate data format, and possibly 2D representations of the original 3D data. In certain embodiments, the intelligent decisions are application, task and/or speed specific. In the case of the CAD view and mark-up application, the viewable data format and the 2D representations may be loaded. In the case of the CAD-inspect application (where calculations to nominal may be performed), the viewable format may be first loaded (to speed up the UI), followed by the proprietary CAD format. Alternatively, the viewable and the native CAD formats may instead be loaded. In each case, intelligent data management may be used to improve the user experience and make the solution feel easy-to-use.

Referring now to FIG. 5C, the operations performed at block 515 are described in more detail. In particular, at block 570 a user input relating to view control is received. Depending on whether the control is a zoom, pan or rotate command, the process will move to either block 575, 580 or 585, respectively. It should be appreciated that the view control process functions in both the virtual world (e.g., in a CAD image) and in a merged image in which native CAD data and real world images or video are combined. The image may be the native CAD data, a viewable representation of the data, a real world image, real world video, or any combination of the above.

Referring now to FIGS. 6A-6B, real world imagery may be augmented in capability and functionality through the integration, by a mobile device (e.g., mobile device 105), of native CAD data, user-defined markup—draw and tags, and images and video of the real world. Specifically, process 600 describes a native CAD markup process which expands the native CAD view process 500 by adding markup controls—draw and tag functionality. The native CAD markup process can be used for design & engineering, first article inspection, part inspection, production inspection, tool building, assembly, composite ply layout, marking, etching, and painting.

The application is executed on a mobile device (block 605), and a CAD file imported into the mobile device (block 610), process 600 will provide the user with the previously-described view control options (block 615), as well as user markup options (block 620), which will be described below with reference to FIG. 6B. It should be appreciated that the view controls (block 615) apply in both in the virtual world (CAD data) and in the context of combined native CAD data and real world imagery.

At block 625, the user interface will enter a wait-and-respond state in which the system waits for a user input, such as an icon selection. It should be appreciated that any type of known user input would be received and recognized, including for example a double-tap to cause the part to reset to its original state, a one finger dragging across screen to "pan" the view of the part, or two fingers to "rotate" or "zoom" the view of the part, etc. Additionally, in certain embodiments the user may extract information from the CAD data by, for example, selecting a "wall" to determine wall thickness, selecting two points on the part to determine distance, selecting a feature to determine relevant parameters about the selected feature, etc. In any event, once the resulting image is generated, it may be emailed or otherwise transmitted to a desired recipient (block 630) and/or stored for later retrieval (block 635).

FIG. 6B illustrates the process associated with the user markup functionality of block 620. Specifically, at block 640 the user is provided with the option to draw and/or erase the image data (block 645) or tag features of the data (block 650). The term 'tagging' or 'tag' refers to the attaching of a tag or flag to a feature such that a block of text can be added without having the text overlay over the screen. The tag represents the text and the text may be made viewable whenever the corresponding tag is selected. The text may also be outputted for every tag in an email along with the current screen image.

In the event the user chooses to tag one or more image features at block 640, the process will continue to block 650 where the tag is applied to the desired feature, and then named or otherwise labeled (block 655). Thereafter, at block 660 the user may provide addition relevant information, such as by attaching text, image, video, or other information. It should be appreciated that the user markup process may be used for image data originating in a virtual context (e.g., CAD data), as well as a combination of virtual and real world imagery, as described above.

Figure 7C:
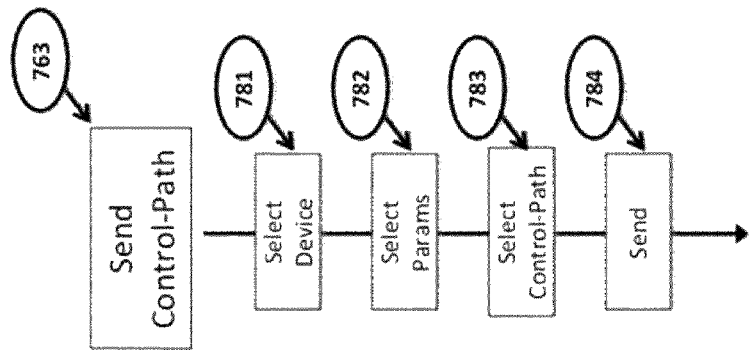
FIG. 7A-7C depict flow diagrams corresponding to further augmenting real world imagery in capability and functionality through the integration, by a mobile device, of native CAD data real world images and video in a manner that provides a more precise feedback for better control of the equipment.
Figure 7B:
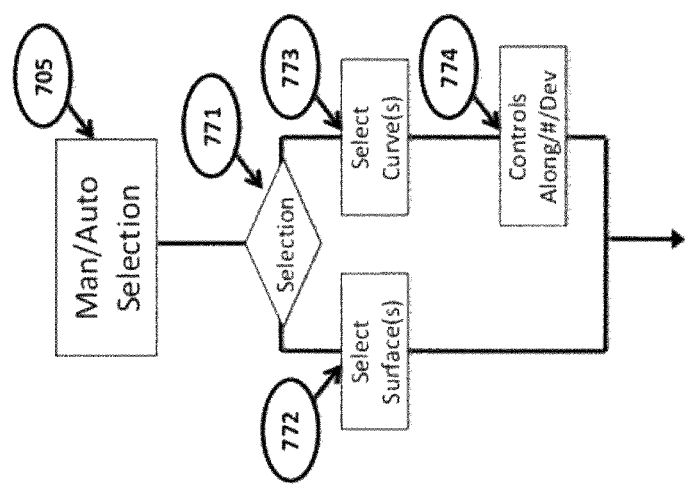
Figure 7A:
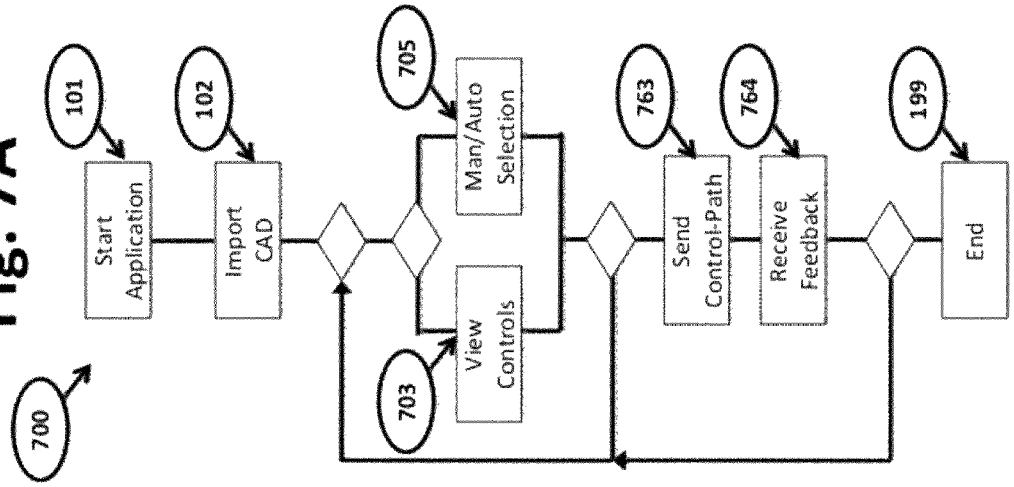

With reference now to FIGS. 7A-7C, real world control of equipment for sensing, testing, measurement and related processes is augmented in capability and functionality through the integration of a mobile device (e.g., mobile device 105) and a piece of equipment (e.g., equipment 115) that provides a more precise feedback for better control of the equipment. As described herein, the equipment can be any data input device whether used for measurement, testing, sensing (vibration analysis, size, distance, etc), inspection, quality control, assembly, reverse engineering, automation, robot control, surgical and medical equipment control, communication and reporting, device and peripherals control, marking, etching, projection or other.

FIG. 7A illustrates one embodiment of a native CAD project process which expands on the native CAD markup process described above (process 500 of FIGS. 5A-5C) by incorporating interface and control functionality of a projection device. The Native CAD Project Application expands on the Native CAD Markup Application by adding an interface and controls to a projection device. The projection device may be a laser or video projector and is used to overlay an image from the mobile device into the real world. The Native CAD Project Application can be used for design & engineering, first article inspection, part inspection, production inspection, tool building, assembly, composite ply layout, marking, etching, and painting.

Process 700 begins similar to process 500 with a native CAD project application being executed on a mobile device, such as mobile device 105, in a system, such as system 100 of FIG. 1A. At block 510, a CAD file is imported into the mobile device (see FIG. 5B above). Thereafter, a user interface of the mobile device functions to receive one or more user inputs regarding how the CAD file data is viewed (see FIG. 5C above). In addition, however, the user is also provided with a feature selection option, as will be described in more detail below with reference to FIG. 7B. In additional to manual selection, it should further be appreciated that, for some applications, process may automatically select all curves, all connected curves, all surface, or any other viewable feature.

Once the selection operation of block 720 is complete, process 700 may continue to block 725 where the corresponding instructions for controlling the projection device may be sent, as will be described in more detail below with reference to FIG. 7C. Feedback corresponding to the position of the laser may then be received at block 730. While some projectors output only laser only, other laser projectors are capable of measurement as well, such that the system is capable of projecting, measuring its own position, then correcting.

Referring now to FIG. 7B, the selection process of block 720 is described in more detail. In particular, a selection input from a user is first received at block 735. In the embodiment of FIG. 7B, the user may select one or more surfaces (block 740) or one or more curves (block 745) using the mobile device's user interface. Such selected features correspond to the CAD data file previously imported into the device at block 710. It should similarly be appreciated that other selection options may be available, such as choosing from displayed solids, surfaces, faces, features, forms, and curves.

Once the desired feature(s) have been selected, the process may continue to block 750 where the can also define appropriate controls for the projection. Example controls are based on view, deviation within tolerance from the perfect form, and steps along the projection within the speed of the projector.

FIG. 7C describes in more detail the operation of block 725 in which instructions for controlling the projection device are provided by the mobile device. In particular, where there are multiple connected devices, the user may be first provided with the opportunity to select a particular device (block 755), and then which parameters should be used (block 760). Such parameters may include, for example, (a) which projection path, (b) on which part, (c) with what intensity, (d) at what speed, (e) for what interval (f) for which operator, (g) at which station, (h) in which building, etc. Thereafter, the control path to be used may be set by the user, or alternatively may be based on one or more external factors, such as the particular device to be controlled. Finally, the command may be sent at block 770. As described above with reference to FIG. 2, the mobile device may send commands (and receive data) via a communication server of the portable mobile device extender 110.

It should be appreciated that the foregoing is equally applicable to any mobile device and any application in which mobile device capabilities may be extended. It should further be appreciated that any mobile device may be configured to connect to the mobile device extender, in accordance with the principles of the invention, and that the invention is independent of any particular operating system that the mobile device may be running. The portable mobile device extender itself may have an operating system which differs from that of the mobile device.

While certain exemplary embodiments have been described and shown in the accompanying drawings, it is to be understood that such embodiments are merely illustrative of and not restrictive on the broad invention, and that this invention not be limited to the specific constructions and arrangements shown and described, since various other modifications may occur to those ordinarily skilled in the art. Trademarks and copyrights referred to herein are the property of their respective owners.

What is claimed is:

1. A system for extending mobile device functionality comprising:
   a mobile device;
   a portable mobile device extender coupled to the mobile device via a first communication link; and
   a piece of measuring equipment coupled to the portable mobile device extender over a second communication link,
   wherein the portable mobile device extender is configured to,
      receive a command from the mobile device over the first communication link, wherein the command has a first format, convert the command into a second format, wherein the second format corresponds to the piece of measuring equipment, provide the command to the piece of measuring equipment in the second format over the second communication link, receive, over the second communication link, a raw stream of data from the piece of measuring equipment that is responsive to said command, and provide measurement-related data to the mobile device, wherein the measurement-related data is based on said raw stream of data, wherein further the mobile device is configured to,
import a native computer-aided design (CAD) file,
compare at least a portion of said measurement-related data received from the portable mobile device extender to a nominal set of data from said CAD file, and
generate a report that includes results of said comparing.

2. The portable mobile device extender of claim 1, wherein the second format is a device-specific communication protocol, and the first format is not device specific.

3. The portable mobile device extender of claim 1, wherein the command corresponds to one or more of an instruction to return a current position, return a current vector, establish communication and perform device-specific task.

4. The portable mobile device extender of claim 1, wherein the mobile device is further configured to apply a fitting algorithm to the measurement-related data in connection with a fit geometry operation.

5. The portable mobile device extender of claim 4, wherein the mobile device is further configured to compare results from the fit geometry operation to a predetermined tolerance.

6. The portable mobile device extender of claim 1, wherein the measurement-related data comprises a full set of sampled data points received from the piece of measuring equipment corresponding to a single operator action.

7. The portable mobile device extender of claim 6, wherein the mobile device is further configured to,
average together at least two individual sampled data points from said full set of sampled data points which have values within a predetermined tolerance of each other,
defining a single resultant sampled data point based on the average of the at least two individual sampled data points, and
adding the single resultant sampled data point to a point set to be analyzed in connection with a fit geometry operation.

8. The portable mobile device extender of claim 7, wherein the mobile device is further configured add individual sampled data points to the point set to be analyzed only when such individual sampled data points differ by more than said predetermined tolerance.

9. A method for extending mobile device functionality comprising the acts of:

receiving, by a portable mobile device extender, a command from a mobile device over a first communication link, wherein the command has a first format;

converting the command into a second format, wherein the second format corresponds to a piece of measuring equipment coupled to the portable mobile device extender over a second communication link;

providing the command to the piece of measuring equipment in the second format over the second communication link;

receiving, over the second communication link, a raw stream of data from the piece of measuring equipment that is responsive to said command;

providing measurement-related data to the mobile device, wherein the measurement-related data is based on said raw stream of data;

importing, by the mobile device, a native computer-aided design (CAD) file;

comparing, by the mobile device, at least a portion of said measurement-related data received from the portable mobile device extender to a nominal set of data from said CAD file; and generating a report that includes results of said comparing.

10. The method of claim 9, wherein the second format is a device-specific communication protocol, and the first format is not device specific.

11. The method of claim 9, wherein the command corresponds to one or more of an instruction to return a current position, return a current vector, establish communication and perform device-specific task.

12. The method of claim 9, further comprising applying, by the mobile device, a fitting algorithm to the measurement-related data in connection with a fit geometry operation.

13. The method of claim 12, further comprising comparing, by the mobile device, results from the fit geometry operation to a predetermined tolerance.

14. The method of claim 9, wherein the measurement-related data comprises a full set of sampled data points received from the piece of measuring equipment corresponding to a single operator action.

15. The method of claim 14, further comprising the acts of:
averaging together at least two individual sampled data points from said full set of sampled data points which have values within a predetermined tolerance of each other;
defining a single resultant sampled data point based on the average of the at least two individual sampled data points; and
adding the single resultant sampled data point to a point set to be analyzed in connection with a fit geometry operation.

16. The method of claim 15, further comprising adding individual sampled data points to the point set to be analyzed only when such individual sampled data points differ by more than said predetermined tolerance.

* * * * *